(12) United States Patent
Wang et al.

(10) Patent No.: US 7,586,721 B2
(45) Date of Patent: Sep. 8, 2009

(54) ESD DETECTION CIRCUIT

(75) Inventors: Chang-Tzu Wang, Taipei (TW); Ming-Dou Ker, Hsinchu County (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/775,225

(22) Filed: Jul. 10, 2007

(65) Prior Publication Data
US 2009/0015974 A1 Jan. 15, 2009

(51) Int. Cl.
*H02H 9/00* (2006.01)
(52) U.S. Cl. .................... 361/56; 361/91.1; 361/111
(58) Field of Classification Search ............... 361/56, 361/91.1, 111
See application file for complete search history.

(56) References Cited

U.S. PATENT DOCUMENTS

| | | | |
|---|---|---|---|
| 5,956,219 A | 9/1999 | Maloney | |
| 6,690,555 B1 * | 2/2004 | Pasqualini | 361/56 |
| 6,747,501 B2 * | 6/2004 | Ker et al. | 327/310 |
| 6,954,098 B2 | 10/2005 | Hsu et al. | |
| 7,221,551 B2 * | 5/2007 | Chen | 361/230 |
| 7,283,342 B1 * | 10/2007 | Ker et al. | 361/56 |
| 2003/0076636 A1 | 4/2003 | Ker et al. | |
| 2007/0285854 A1 * | 12/2007 | Rodgers et al. | 361/56 |

* cited by examiner

*Primary Examiner*—Danny Nguyen
*Assistant Examiner*—Tien Mai
(74) *Attorney, Agent, or Firm*—Winston Hsu

(57) ABSTRACT

An ESD detection circuit which includes: a triggering circuit for generating an ESD trigger signal when the ESD detection circuit is in ESD mode; a bias circuit for providing at least a first bias voltage and a second bias voltage for controlling the operation of the triggering circuit; a trigger controlling circuit for decreasing a voltage difference between the first bias voltage and the second bias voltage when the ESD detection circuit is in the ESD mode, and for controlling a duration of the ESD trigger signal that is generated by the triggering circuit; and an activating control circuit for activating the trigger controlling circuit and the triggering circuit to enter the ESD mode according to a voltage level at a first node.

7 Claims, 4 Drawing Sheets

ESD DETECTION CIRCUIT

BACKGROUND OF THE INVENTION

1. Field of the Invention

The present invention relates to an ESD (electrostatic discharge) detection circuit and related method, and more particularly, to an ESD detection circuit and related method capable of reducing a size of the ESD detection circuit itself and extending a duration of discharge.

2. Description of the Prior Art

Please refer to FIG. 1. FIG. 1 is a diagram of a prior art ESD protection circuit 10. The ESD protection circuit 10 includes a low-pass filter 11 having a resistor R and a capacitor C, an inverter 12, and an ESD Clamp Circuit 13. The inverter 12 is composed of a P-type field effect transistor (FET) MP and a N-type FET MN. When an electrostatic signal Sesd rises at a first node Na of the ESD protection circuit 10, a voltage level at a second node Nb is temporarily maintained at a lower level because of the low-pass filter 11. The P-type FET MP is turned on and the N-type FET MN is turned off. Accordingly, through the P-type FET MP, the electrostatic signal Sesd is converted into a current signal I_trig, which is utilized for triggering the ESD clamp circuit 13 to perform a discharge operation upon the electrostatic signal Sesd at the first node Na. However, when the voltage level at the first node Na is higher than that of a normal supply voltage VDD (e.g. the voltage level at the first node Na equals 3*VDD), gate-oxide layers of the capacitor C, the P-type FET MP, and the N-type FET MN will be damaged since voltage drops across the gate-oxide layers will become much larger. In summary, the ESD protection circuit 10 cannot absorb the electrostatic signal Sesd which has greater voltage amplitudes. Further description is detailed in US patent application pub. No. 20030076636A1.

In addition, according to U.S. Pat. No. 5,956,219, another ESD protection circuit is disclosed. Although the ESD protection circuit is able to absorb an electrostatic signal having greater voltage amplitudes, this ESD protection circuit implemented by a triple well process has some disadvantages. The ESD protection circuit increases cost of production and complicates the gate-driven technique, especially when an advanced nano-scale CMOS (Complementary Metal-Oxide-Semiconductor) process is applied.

Additionally, according to U.S. Pat. No. 6,954,098, an ESD protection circuit is further disclosed. Similarly, the ESD protection circuit is also capable of absorbing an electrostatic signal having greater voltage amplitudes. In addition to a normal supply voltage, however, this ESD protection circuit further requires a lower supply voltage for proper operation. If either one of the normal or lower supply voltages is not provided, gate-oxide layers of FETs within the ESD protection circuit could be damaged. Consequently, in order to avoid the above-mentioned problems, the ESD protection circuit disclosed by U.S. Pat. No. 6,954,098 is usually implemented by the thicker gate-oxide layer process technique, subsequently increasing cost of production.

SUMMARY OF THE INVENTION

It is therefore one of the objectives of the present invention to provide an ESD detection circuit and related method, to solve the above-mentioned problems.

According to an embodiment of the claimed invention, an ESD detection circuit is disclosed. The ESD detection circuit is coupled between a first node and a second node, and the ESD detection circuit comprises a triggering circuit, a bias circuit, a trigger controlling circuit, and an activating control circuit. The triggering circuit is utilized for generating an ESD trigger signal when the ESD detection circuit is in ESD mode. The bias circuit is coupled to the triggering circuit and utilized for providing at least a first bias voltage and a second bias voltage to control the operation of the triggering circuit. The trigger controlling circuit is coupled to the bias circuit and the triggering circuit, and the trigger controlling circuit is utilized for decreasing a voltage difference between the first bias voltage and the second bias voltage when the ESD detection circuit is in the ESD mode, to control a duration of the ESD trigger signal generated by the triggering circuit. The activating control circuit is coupled to the trigger controlling circuit and the trigger circuit, and it is utilized for activating the trigger controlling circuit and the triggering circuit to enter the ESD mode according to a voltage level at the first node.

According to another embodiment of the claimed invention, a method for generating an ESD trigger signal corresponding to a first node and a second node is disclosed. The method comprises: activating an ESD mode according to a voltage level at the first node; providing a trigger circuit and utilizing the trigger circuit to generate the ESD trigger signal in the ESD mode; providing at least a first bias voltage and a second bias voltage to control an operation of the trigger circuit; and decreasing a voltage difference between the first bias voltage and the second bias voltage in the ESD mode, for controlling a duration of the ESD trigger signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
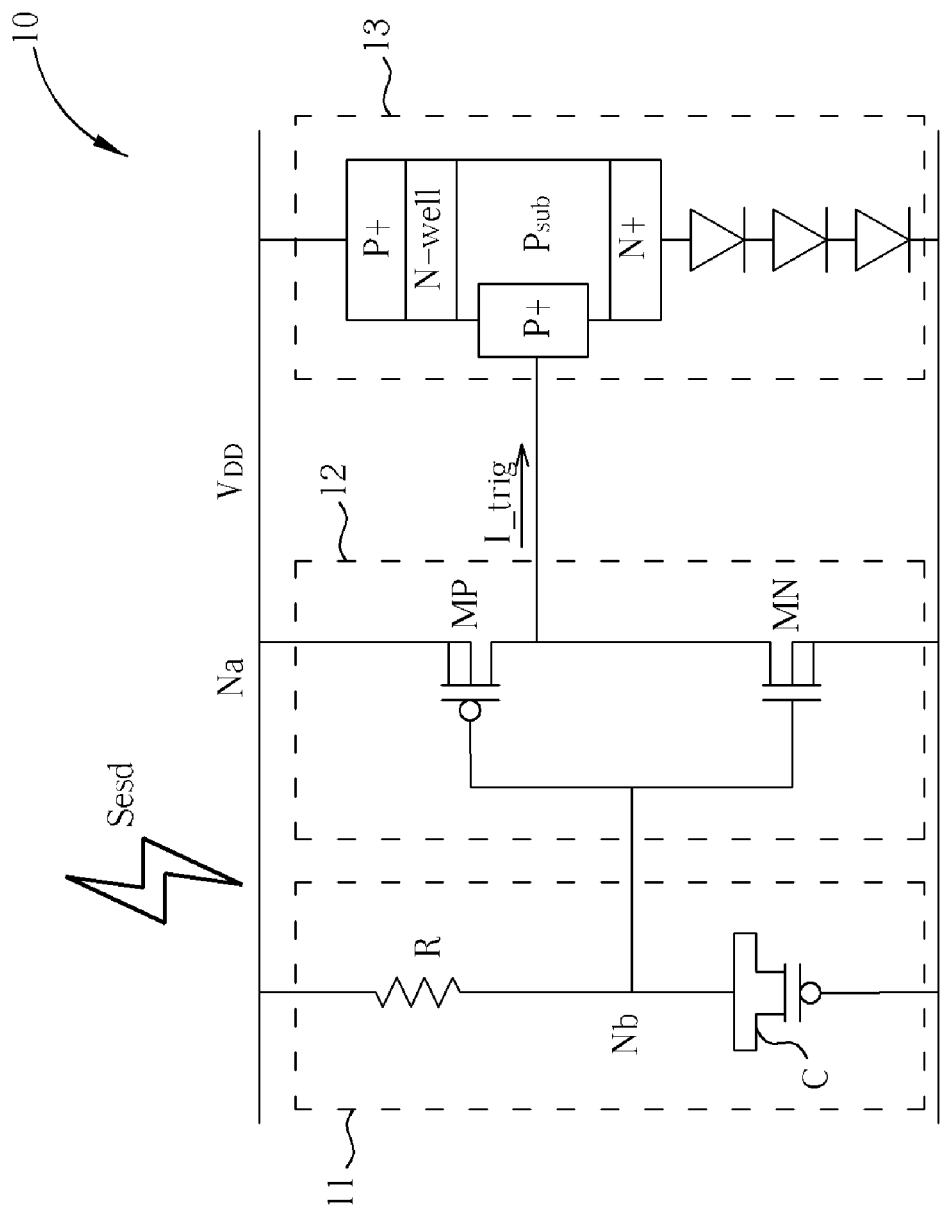
FIG. 1 is a diagram of a prior art ESD protection circuit.
Figure 2:
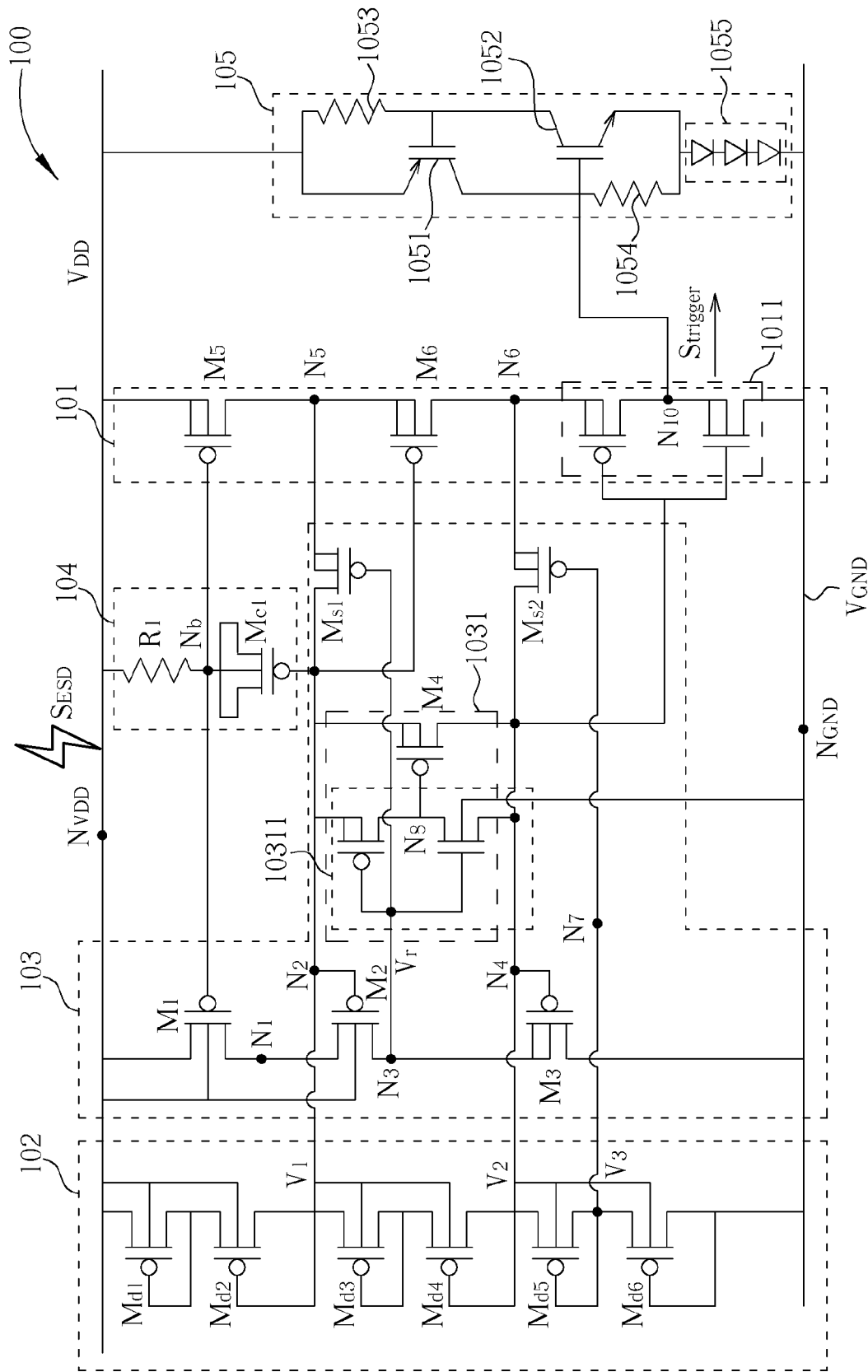
FIG. 2 is a diagram of an ESD detection circuit according to an embodiment of the present invention.

Please refer to FIG. 2. FIG. 2 is a diagram of an ESD detection circuit 100 according to an embodiment of the present invention. The ESD detection circuit 100 includes a triggering circuit 101, a bias circuit 102, a trigger controlling circuit 103, and an activating control circuit 104. The ESD detection circuit 100 is coupled between a first node $N_{VDD}$ and a second node $N_{GND}$. The triggering circuit 101 is utilized for generating an ESD trigger signal $S_{trigger}$ when the ESD detection circuit 100 is in ESD mode. The bias circuit 102 is coupled to the triggering circuit 101 and utilized for providing a first bias voltage $V_1$, a second bias voltage $V_2$, and a third bias voltage $V_3$, for controlling the operation of the triggering circuit 101. The trigger controlling circuit 103 is coupled to the bias circuit 102 and the triggering circuit 01; the trigger controlling circuit 103 is utilized for decreasing a voltage difference $V_{diff}$ between the first bias voltage $V_1$ and the second bias voltage $V_2$ in the ESD mode, to control a duration $T_{trigger}$ of the ESD trigger signal $S_{trigger}$, which is generated by the triggering circuit 101. The activating control circuit 104 is coupled to the trigger controlling circuit 103 and the triggering circuit 101. The activating control circuit 104 is utilized for activating the trigger controlling circuit 103 and triggering circuit 101 to enter the ESD mode according to a voltage level $V_{DD}$ at the first node $N_{VDD}$. Please note that, in order to describe the spirit of the ESD detection circuit 100 disclosed in this embodiment more clearly, an ESD clamp circuit 105 is further coupled to the first node $N_{VDD}$, the second node $N_{GND}$, and the triggering circuit 101. The ESD clamp circuit 105 is used for performing a discharge operation upon the voltage at the first node $N_{VDD}$ according to the ESD trigger signal $S_{trigger}$. Specifically, the ESD clamp circuit 105 includes a PNP BJT (bipolar junction transistor) 1051, an NPN BJT 1052, a N-well resistor 1053, a P-well resistor 1054, and a plurality of diodes 1055. The configuration of the ESD clamp circuit 105 is shown in FIG. 2 but is not detailed for the sake of brevity.

As shown in FIG. 2, the bias circuit 102 is coupled between the first node $N_{VDD}$ and the second node $N_{GND}$. The bias circuit 102 includes a plurality of P-type FETs $M_{d1}$, $M_{d2}$, $M_{d3}$, $M_{d4}$, $M_{d5}$, and $M_{d6}$ with a first, second, third, fourth, fifth, and sixth diode-connected configurations, respectively. These diode-connected P-type FETs $M_{d1}$, $M_{d2}$, $M_{d3}$, $M_{d4}$, $M_{d5}$, and $M_{d6}$ are connected between the first node $N_{VDD}$ and the second node $N_{GND}$ in a cascading arrangement, and they are utilized for generating the first bias voltage $V_1$, the second bias voltage $V_2$, and the third bias voltage $V_3$, according to the voltage levels (i.e. $V_{DD}$ and $V_{GND}$) at the first node $N_{VDD}$ and second node $N_{GND}$. In the bias circuit 102, not all base terminals of the diode-connected FETs are coupled to source terminals of the same diode-connected FETs: the base terminals of the first and second P-type FETs $M_{d1}$ and $M_{d2}$ are coupled to the first node $N_{VDD}$, the base terminals of the third and fourth P-type FETs $M_{d3}$ and $M_{d4}$ are coupled to the first bias voltage $V_1$, and the base terminals of the fifth and sixth P-type FETs $M_{d5}$ and $M_{d6}$ are coupled to the second bias voltage $V_2$. The activating control circuit 104 includes a resistor $R_1$ and a capacitor $M_{C1}$. The resistor $R_1$ is serially connected to the first node $N_{VDD}$ and a first terminal $N_b$ of the capacitor $M_{C1}$.

The trigger controlling circuit 103 includes a first P-type FET $M_1$, a second P-type FET $M_2$, a third P-type FET $M_3$, a first switching FET $M_{s1}$, a second switching FET $M_{s2}$, and a voltage level controlling circuit 1031. The P-type FET $M_1$ has a source terminal coupled to the first node $N_{VDD}$ and a gate terminal coupled to the first terminal $N_b$ of the capacitor $M_{C1}$. The second P-type FET $M_2$ has a source terminal coupled to a drain terminal (i.e. $N_1$) of the first P-type FET $M_1$ and a gate terminal (i.e. $N_2$) coupled to the first bias voltage $V_1$. The third P-type FET $M_3$ has a source terminal coupled to a drain terminal (i.e. $N_3$) of the second FET $M_2$, a gate terminal (i.e. a node $N_4$) coupled to the second bias voltage $V_2$, and a drain terminal $N_{dm3}$ coupled to the second node $N_{GND}$. The first switching P-type FET $M_{s1}$ has a drain terminal (i.e. $N_2$) coupled to the bias voltage $V_1$ and the activating control circuit 104, a source terminal coupled to the triggering circuit 101 (i.e. $N_5$), and a gate terminal coupled to the drain terminal (i.e. $N_3$) of the second P-type FET $M_2$. The second switching P-type FET $M_{s2}$ has a drain terminal (i.e. $N_4$) coupled to the second bias voltage $V_2$, a source terminal coupled to a node $N_6$ of the triggering circuit 101, and a gate terminal (i.e. $N_7$) coupled to the third bias voltage. Additionally, the voltage level controlling circuit 1031 is coupled between the drain terminals of the first switching P-type FET $M_{s1}$ and second switching P-type FET $M_{s2}$. The voltage level controlling circuit 1031 is utilized for decreasing the voltage difference $V_{diff}$ between the first bias voltage $V_1$ and second bias voltage $V_2$ according to a voltage level $V_r$ at the drain terminal of the second P-type FET $M_2$ when the ESD detection circuit 100 is in the ESD mode. In this embodiment, the voltage level controlling circuit 1031 includes a first inverter 10311 and a fourth P-type FET $M_4$; the first inverter 10311 is comprised of a P-type FET and a N-type FET (as shown in FIG. 2). The first inverter 10311 has a first reference node coupled to the gate terminal (i.e. $N_2$) of the second P-type FET $M_2$, a second reference node coupled to the gate terminal (i.e. $N_4$) of the third P-type FET $M_3$, and an input node coupled to the drain terminal of the second P-type FET $M_2$. The fourth P-type FET $M_4$ has a source terminal coupled to the gate terminal of the second P-type FET $M_2$, a drain terminal coupled to the gate terminal of the third P-type FET $M_3$, and a gate terminal coupled to an output node $N_8$ of the first inverter 10311.

The triggering circuit 101 includes a fifth P-type FET $M_5$, a sixth P-type FET $M_6$, and a second inverter 1011. The fifth P-type FET $M_5$ has a source terminal coupled to the first node $N_{VDD}$, a gate terminal coupled to the first terminal $N_b$ of the capacitor $M_{C1}$, and a drain terminal coupled to the source terminal (i.e. $N_5$) of the first switching P-type FET $M_{s1}$. The sixth P-type FET $M_6$ has a source terminal coupled to the drain terminal of the fifth P-type FET $M_5$ and source terminal of the first switching P-type FET $M_{s1}$, a gate terminal coupled to the drain terminal (i.e. $N_2$) of the first switching p-type FET $M_{s1}$, and a drain terminal (i.e. $N_6$) coupled to the source terminal of the second switching P-type FET $M_{s2}$. The second inverter 1011 is comprised of a P-type FET and a N-type FET (as shown in FIG. 2). The second inverter 1011 has a first reference node coupled to the drain terminal of the sixth P-type FET $M_6$, a second reference node coupled to the second node $N_{GND}$, an input node coupled to the drain terminal of the second switching P-type FET $M_{s2}$, and an output node $N_{10}$ utilized for outputting the ESD trigger signal $S_{trigger}$.

In this embodiment, the ESD detection circuit 100 can operate under two modes (the ESD mode and a normal mode). When the ESD detection circuit 100 operates in the normal mode, the N-type FET in the second inverter 1011 is utilized for maintaining a voltage level of the output node $N_{10}$ at the ground level $V_{GND}$, and the first node $N_{VDD}$ is coupled to a supply voltage $V_{DD}$. In order to describe the spirit of the present invention more clearly, it is assumed that the ground level $V_{GND}$ and the supply voltage $V_{DD}$ equal zero and 3.3 volts respectively. Therefore, in normal mode, the first bias voltage $V_1$, the second bias voltage $V_2$, and the third bias voltage $V_3$ are respectively equal to 2.2 volts, 1.1 volts, and 0.6 volts. Please note that, since the base terminal of the P-type FET $M_{d6}$ is coupled to the node $N_4$, there exists a body effect in the P-type FET $M_{d6}$. The third bias voltage $V_3$ thus becomes 0.6 volts, and the second switching FET $M_{s2}$ is turned on because of the third bias voltage $V_3$. As shown in FIG. 2, due to the second bias voltage $V_2$, a voltage level at the node $N_6$ is charged through the second switching FET $M_{s2}$ until the voltage level at the node $N_6$ equals 1.1 volts. Since a voltage difference across the source-drain terminals of the P-type FET in the second inverter 1011 is zero, this P-type FET is turned off. Accordingly, in normal mode, the ESD detection circuit 100 does not generate the ESD trigger signal $S_{trigger}$, and the ESD clamp circuit 105 is not enabled. Additionally, the N-type FET in the second inverter 1011 is turned on, so the phase margin of the ESD detection circuit 100 is widened for ensuring that the trigger controlling circuit 103 does not trigger the ESD clamp circuit 105 in normal mode.

Moreover, since the first P-type FET $M_1$ and fifth P-type FET $M_5$ are biased by the supply voltage $V_{DD}$ equaling 3.3 volts, the first P-type FET $M_1$ and fifth P-type FET $M_5$ are turned off. In other words, in normal mode, a current path composed of the P-type FETs $M_1$, $M_2$, and $M_3$ is not conductive, and the P-type FET $M_2$ is turned off. That is to say, a voltage drop across the source-gate terminals of the P-type FET $M_2$ is lower than the threshold voltage $|V_{tp}|$ (i.e. 1.2 volts) of a common P-type FET. Therefore, the voltage level at the node $N_1$ is maintained between 2.2 volts and 2.2 volts plus the threshold voltage $|V_{tp}|$. Similarly, the P-type FET $M_3$ is also turned off, and the voltage level at the node $N_3$ is maintained between 1.1 volts and 1.1 volts plus the threshold voltage $|V_{tp}|$. When the P-type FET of the first inverter 10311 and the first switching FET $M_{s1}$ are turned on, the voltage levels at the nodes $N_2$ and $N_5$ are equal to 2.2 volts. The voltage drops at the source-gate terminals of the N-type FET of the first inverter 10311, the fourth P-type FET $M_4$, and the sixth P-type FET $M_6$ are approximately equal to zero so that they are turned off. As mentioned above, in this embodiment, when the ESD detection circuit 100 operates in normal mode and the supply voltage VDD is equal to 3.3 volts, all FETs having voltage drops equal to 1.2 volts across their gate-oxide layers can operate correctly.

Figure 3:
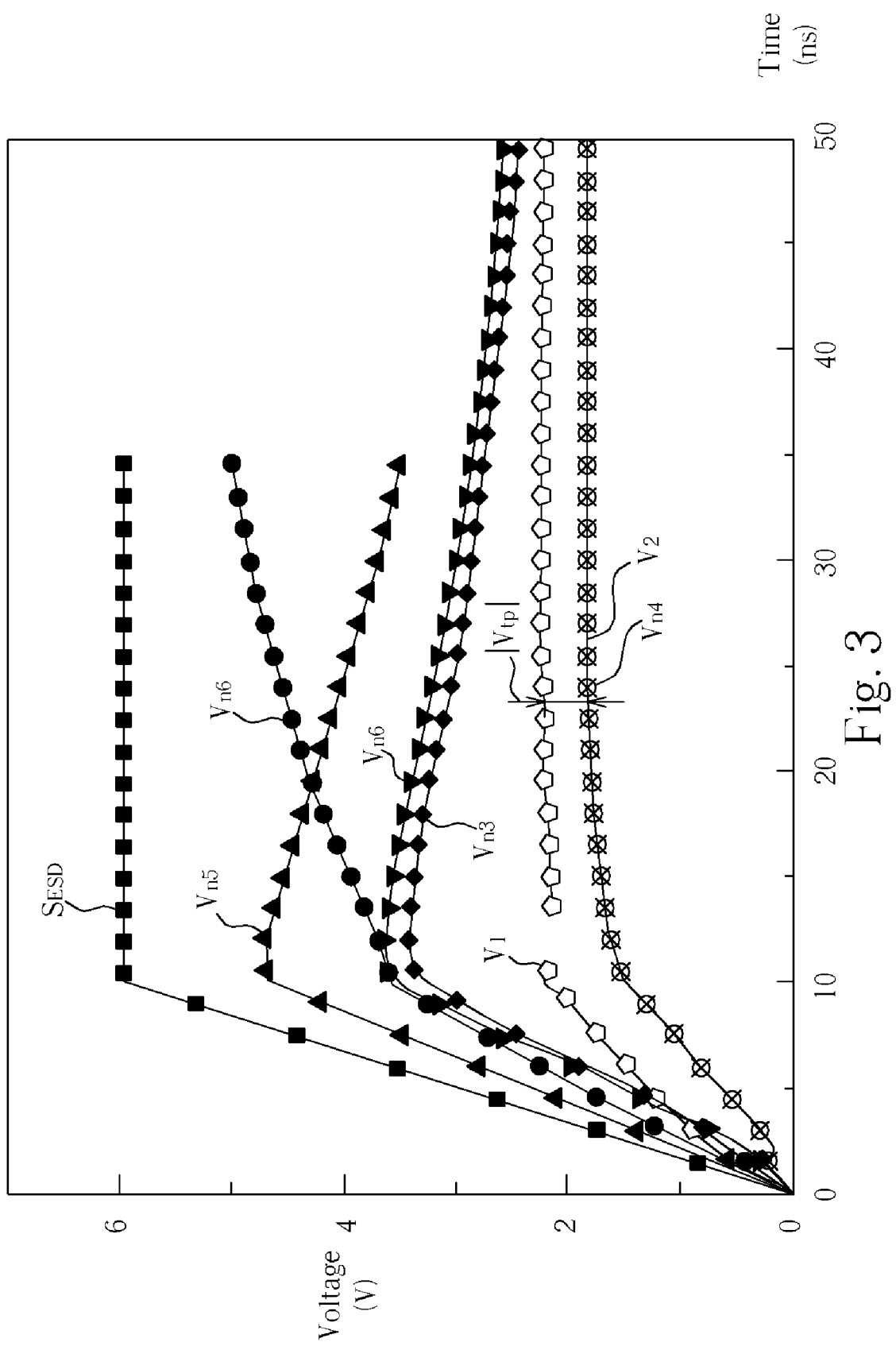
FIG. 3 is a chart showing the electrostatic signal $S_{ESD}$, the first bias voltage $V_1$, the second bias voltage $V_2$, and voltage levels at the nodes $N_b$, $N_3$, $N_4$, $N_5$, and $N_6$ when the ESD detection circuit shown in FIG. 2 operates in the ESD mode.

On the other hand, when the ESD protection circuit 100 is not in normal mode, the supply voltage $V_{DD}$ at the first node $N_{VDD}$ is equal to zero. However, when the electrostatic signal $S_{DD}$ is introduced at the first node $N_{VDD}$ (e.g. the power of the supply voltage $V_{DD}$ is enabled instantaneously), an impulse signal will occur immediately at the voltage level of the first node $N_{VDD}$. A peak value of the impulse signal is usually higher than the supply voltage $V_{DD}$ (i.e. 3.3 volts) in normal mode. This will cause a circuitry coupled to the supply voltage $V_{DD}$ to be damaged. In order to describe the spirit of the present invention more clearly, in this embodiment, a peak value of the electrostatic signal $S_{ESD}$ is assumed to equal 6 volts for illustrative purposes. That is, when the power of the supply voltage $V_{DD}$ is enabled instantaneously, the voltage level of the electrostatic signal $S_{ESD}$ at the first node $N_{VDD}$ rises from zero to 6 volts rapidly (as shown in FIG. 3). FIG. 3 is a chart showing the electrostatic signal $S_{ESD}$, the first bias voltage $V_1$, the second bias voltage $V_2$, and voltage levels (i.e. $V_{nb}$, $V_{n3}$, $V_{n4}$, $V_{n5}$, and $V_{n6}$) at the nodes $N_b$, $N_3$, $N_4$, $N_5$, and $N_6$ when the ESD detection circuit 100 shown in FIG. 2 operates in the ESD mode. When the electrostatic signal $S_{ESD}$ rises and reaches 6 volts at timing $t_1$, the voltage level $V_{nb}$ at the first node $N_b$ rises more slowly than the electrostatic signal $S_{ESD}$ since the activating control circuit 104 is an RC low-pass filter. This will cause a voltage drop across the first node $N_{VDD}$ and the first node $N_b$. The P-type FET $M_1$ and $M_5$ are therefore turned on, and the nodes $N_1$ and $N_5$ are charged so that the voltage levels $V_{n1}$ and $V_{n5}$ at the nodes $N_1$ and $N_5$ raise rapidly. Since the first bias voltage $V_1$, the second bias voltage $V_2$, and the third bias voltage $V_3$ at the nodes $N_2$, $N_4$, and $N_7$ in the timing $t_0$ are approximately equal to zero, the P-type FETs $M_2$ and $M_3$ are also turned on and the nodes $N_3$ and $N_6$ are charged when the electrostatic signal $S_{ESD}$ is introduced. Rising values of the voltage levels $V_{n3}$ and $V_{n6}$ at the nodes $N_3$ and $N_6$ are substantially equal to those at the nodes $N_1$ and $N_5$. The second switching FET $M_{s2}$ is subsequently turned on. This is because the voltage level at node $N_7$ still remains at a lower level than the voltage level $V_{n6}$ at node $N_6$ even as the voltage level $V_{n6}$ is rising. Accordingly, the voltage level $V_{n4}$ at the node $N_4$ is charged and then rises to equal voltage level $V_{n6}$. In practice, however, an RC delay caused by the turned-on resistance of the second switching FET $M_{s2}$ and parasitic capacitance at the node $N_4$ will maintain the voltage level $V_{n4}$ of the node $N_4$ at a lower voltage level, as shown in FIG. 3. Because of the lower voltage level, the second switching FET $M_{s2}$ will be continuously turned on when the electrostatic signal $S_{ESD}$ occurs. Additionally, the voltage level $V_{n3}$ at the gate terminal (i.e. the node $N_3$) of the P-type FET in the first inverter 10311 is higher that that (i.e. the voltage level $V_{n4}$) at the node $N_4$. The N-type FET is therefore turned on so that the voltage level $V_{n8}$ at the node $N_8$ is approximately equal to that (i.e. the voltage level $V_{n4}$) at the node $N_4$. The P-type FET $M_4$ is then turned on so that the first bias voltage $V_1$ at the node $N_2$ is forced to be near the second bias voltage $V_2$ at the node $N_4$. The voltage difference $V_{diff}$ between the first bias voltage $V_1$ and second bias voltage $V_2$ equals the threshold voltage $|V_{tp}|$ of the P-type FET $M_4$.

Additionally, when the ESD detection circuit 100 operates in the ESD mode, since a difference between the voltage levels at the gate and source terminals (i.e. the nodes $N_3$ and $N_5$) of the second switching FET $M_{s2}$ is very small so that the second switching FET $M_{s2}$ will be turned off. The first bias voltage $V_1$ comes to a voltage level which is lower than the voltage level $V_{n5}$. As mentioned above, the voltage levels at the gate terminals (i.e. $N_b$ and $N_2$) of the P-type FETs $M_5$ and $M_6$ in the triggering circuit 101 and the voltage level at the gate terminal (i.e. $N_4$) of the P-type FET in the second inverter 1011 can be maintained at lower levels. Thus, the electrostatic signal $S_{ESD}$ is rapidly converted into the ESD trigger signal $S_{trigger}$, which is transmitted to the node $N_{10}$. It should be noted that those skilled in this art should understand that the ESD trigger signal $S_{trigger}$ is a current signal. Moreover, since the voltage level controlling circuit 1031 of the trigger controlling circuit 103 is a digital control circuit, a size of the trigger controlling circuit 103 can be considerably reduced and the leakage of electricity can also be decreased when the ESD detection circuit 100 operates in the normal mode. The operation of the ESD clamp circuit 105 should be understood by those skilled in this art; further description is not detailed for the sake of the brevity. Furthermore, it should be noted that the triggering circuit 101, the bias circuit 102, the trigger controlling circuit 103 and the activating control circuit 104 can be implemented by transistors having gate dielectrics where thickness of the gate dielectrics is substantially identical. This design modification also falls within the scope of the present invention.

Figure 4:
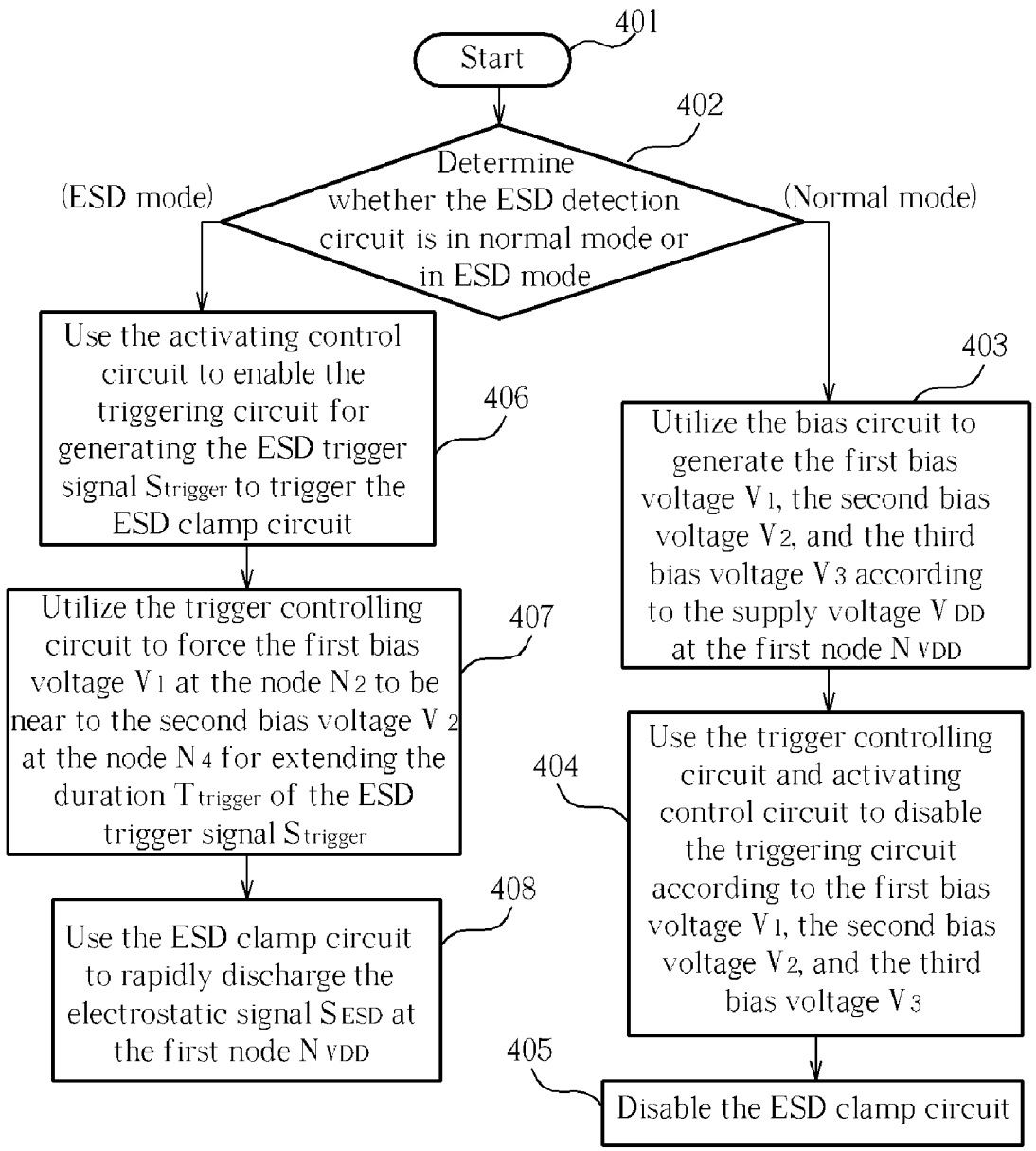
FIG. 4 is a flowchart illustrating an operation of the ESD detection circuit shown in FIG. 2.

Please refer to FIG. 4. FIG. 4 is a flowchart illustrating a method for generating an ESD trigger signal corresponding to a first node and a second node according to a second embodiment of the present invention. Since the method for generating the ESD trigger signal can be implemented with the ESD detection circuit 100 shown in FIG. 2, the flowchart in the following is detailed in conjunction with the ESD detection circuit 100 for describing the spirit of the method more clearly. Provided that substantially the same result is achieved, the steps of the flowchart shown in FIG. 4 need not be in the exact order shown and need not be contiguous; that is, other steps can be intermediate. The method includes the following steps:

Step 401: Start.

Step 402: Determine whether the ESD detection circuit 100 is in normal mode or in ESD mode. When the ESD detection circuit 100 operates under the normal mode, go to Step 403; otherwise, go to Step 406 when the ESD detection circuit 100 operates under the ESD mode.

Step 403: Utilize the bias circuit 102 to generate the first bias voltage $V_1$, the second bias voltage $V_2$, and the third bias voltage $V_3$ according to the supply voltage $V_{DD}$ at the first node $N_{VDD}$.

Step 404: Use the trigger controlling circuit 103 and activating control circuit 104 to disable the triggering circuit 101 according to the first bias voltage $V_1$, the second bias voltage $V_2$, and the third bias voltage $V_3$.

Step 405: Disable the ESD clamp circuit 105.

Step 406: Use the activating control circuit 104 to enable the triggering circuit 101 for generating the ESD trigger signal $S_{trigger}$ to trigger the ESD clamp circuit 105.

Step 407: Utilize the trigger controlling circuit 103 to force the first bias voltage $V_1$ at the node $N_2$ to be near to the second bias voltage $V_2$ at the node $N_4$ for extending the duration $T_{trigger}$ of the ESD trigger signal $S_{trigger}$.

Step 408: Use the ESD clamp circuit 105 to rapidly discharge the electrostatic signal $S_{ESD}$ at the first node $N_{VDD}$.

It should be noted that in Step 402, the supply voltage $V_{DD}$ at the first node $N_{VDD}$ is equal to zero while the ESD detection circuit 100 in not the normal mode. In other words, when the electrostatic signal $S_{ESD}$ rises at the first node $N_{VDD}$, the voltage level at the first node $N_{VDD}$ is initially also equal to zero. Therefore, in Step 407, the trigger controlling circuit 103 will force the first bias voltage $V_1$ at node $N_2$ to be near zero (at node $N_4$). Additionally, the trigger controlling circuit 103 also utilizes the voltage level controlling circuit 1031 to control the P-type FET $M_4$ for forcing the first bias voltage $V_1$ at the node $N_2$ to be near the second bias voltage $V_2$ at the node $N_4$.

Those skilled in the art will readily observe that numerous modifications and alterations of the device and method may be made while retaining the teachings of the invention.

What is claimed is:

1. An ESD (electrostatic discharge) detection circuit, coupled between a first node and a second node, the ESD detection circuit comprising:
    a triggering circuit, for generating an ESD trigger signal when the ESD detection circuit is in an ESD mode;
    a bias circuit, coupled to the triggering circuit, for providing at least a first bias voltage and a second bias voltage to control an operation of the triggering circuit;
    a trigger controlling circuit, coupled to the bias circuit and the triggering circuit, for decreasing a voltage difference between the first bias voltage and the second bias voltage to control a duration of the ESD trigger signal generated by the triggering circuit when the ESD detection circuit is in the ESD mode; and
    an activating control circuit, coupled to the trigger controlling circuit and the triggering circuit, for activating the trigger controlling circuit and the triggering circuit to enter the ESD mode according to a voltage level at the first node.

2. The ESD detection circuit of claim 1, wherein the bias circuit is coupled between the first node and the second node; and the bias circuit comprises:
    a plurality of diode-connected field-effect transistors (FETs), for generating a plurality of voltage dividing signals as the first bias voltage and the second bias voltage according to voltage levels at the first node and the second node;
    wherein not all base terminals of the diode-connected FETs are coupled to source terminals of the diode-connected FETs respectively.

3. The ESD detection circuit of claim 1, wherein the bias circuit is further utilized for providing a third bias voltage; the activating control circuit comprises a resistor and a capacitor where the resistor is serially connected to the first node and a first terminal of the capacitor; and the trigger controlling circuit comprises:
    a first FET having a first terminal coupled to the first node and a control terminal coupled to the first terminal of the capacitor;
    a second FET having a first terminal coupled to a second terminal of the first FET and a control terminal coupled to the first bias voltage;
    a third FET having a first terminal coupled to the second terminal of the second FET, a control terminal coupled to the second bias voltage, and a second terminal coupled to the second node;
    a first switching FET having a first terminal coupled to the first bias voltage and the activating control circuit, a second terminal coupled to the triggering circuit, and a control terminal coupled to the second terminal of the second FET;
    a second switching FET having a first terminal coupled to the second bias voltage, a second terminal coupled to the triggering circuit, and a control terminal coupled to the third bias voltage; and
    a voltage level controlling circuit, coupled between the first terminal of the first switching FET and the first terminal of the second switching FET, for decreasing the voltage difference between the first bias voltage and the second bias voltage according to a voltage level at the second terminal of the second FET when the ESD detection circuit is in the ESD mode.

4. The ESD detection circuit of claim 3, wherein the voltage level controlling circuit comprises:
    a first inverter having a first reference node coupled to the control terminal of the second FET, a second reference node coupled to the control terminal of the third FET, an input node coupled to the second terminal of the second FET; and
    a fourth FET having a first terminal coupled to the control terminal of the second FET, a second terminal coupled to the control terminal of the third FET, and a control terminal coupled to an output node of the first inverter.

5. The ESD detection circuit of claim 3, wherein the triggering circuit comprises:
    a fifth FET having a first terminal coupled to the first node, a control terminal coupled to the first terminal of the capacitor, and a second terminal coupled to the second terminal of the first switching FET;
    a sixth FET having a first terminal coupled to the second terminal of the fifth FET and the second terminal of the first switching FET, a control terminal coupled to the first terminal of the first switching FET, and a second terminal coupled to the second terminal of the second switching FET; and
    a second inverter having a first reference node coupled to the second terminal of the sixth FET, a second reference node coupled to the second node, an input node coupled to the first terminal of the second switching FET, and an output node for outputting the ESD trigger signal.

6. The ESD detection circuit of claim 1, wherein the triggering circuit, the bias circuit, the trigger controlling circuit and the activating control circuit are implemented by transistors having gate dielectrics where thickness of the gate dielectrics is substantially identical.

7. A method for generating an ESD trigger signal corresponding to a first node and a second node, comprising:
   activating an ESD mode according to a voltage level at the first node;
   providing a triggering circuit, and utilizing the triggering circuit to generate the ESD trigger signal in the ESD mode;
   providing at least a first bias voltage and a second bias voltage to control an operation of the triggering circuit; and
   decreasing a voltage difference between the first bias voltage and the second bias voltage to control a duration of the ESD trigger signal in the ESD mode.

\* \* \* \* \*